(12) United States Patent
Okayasu et al.

(10) Patent No.: US 6,807,243 B2
(45) Date of Patent: Oct. 19, 2004

(54) DELAY CLOCK GENERATING APPARATUS AND DELAY TIME MEASURING APPARATUS

(75) Inventors: Toshiyuki Okayasu, Tokyo (JP); Shinya Sato, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/421,497

(22) Filed: Apr. 23, 2003

(65) Prior Publication Data

US 2003/0194038 A1 Oct. 16, 2003

Related U.S. Application Data

(62) Division of application No. 09/541,910, filed on Apr. 3, 2000, now Pat. No. 6,597,753.

(30) Foreign Application Priority Data

Apr. 2, 1999 (JP) .......................................... H11-95941

(51) Int. Cl.[7] ............................. H04L 25/38; H04D 3/24
(52) U.S. Cl. ........................ 375/371; 375/373; 327/152; 327/161
(58) Field of Search ................................ 375/222, 229, 375/371, 373, 377; 327/151–153, 161, 162; 455/242.01, 243.01

(56) References Cited

U.S. PATENT DOCUMENTS

| 4,755,704 A | * | 7/1988 | Flora et al. ................. 327/152 |
| 5,537,069 A | * | 7/1996 | Volk ........................... 327/149 |
| 6,084,930 A | * | 7/2000 | Dinteman ................... 375/354 |
| 6,289,068 B1 | * | 9/2001 | Hassoun et al. ............ 375/376 |

* cited by examiner

*Primary Examiner*—Emmanuel Bayard
*Assistant Examiner*—Qutub Ghulamali
(74) *Attorney, Agent, or Firm*—Osha & May L.L.P.

(57) ABSTRACT

A standard clock 34 is input to a phase comparator 52 and a phase controller 56. The ring oscillator 50 oscillates a shift clock 70 having a same cycle as the standard clock 34. The phase comparator 52 matches the downward shift of the shift clock 70 with the downward shift of the standard clock 34 to output a shift clock 72. The shift clock 72 is supplied to the pulse inserter 54. The phase controller 56 receives the standard clock 34 and generates a phase control signal 74 indicating cycles of the shift clock 72 to which the insert-pulses are inserted among a plurality of cycles of the shift clock 72. The pulse inserter 54 inserts the insert-pulses to the cycles of the shift clock indicated by the phase control signal 74. The phase-lock unit 58 generates a delay clock 82 by delaying the phase of the shift clock 70 oscillated by the ring oscillator 50 with respect to the phase of the standard clock, based on the standard clock and the shift clock 76 including the insert-pulses.

5 Claims, 11 Drawing Sheets

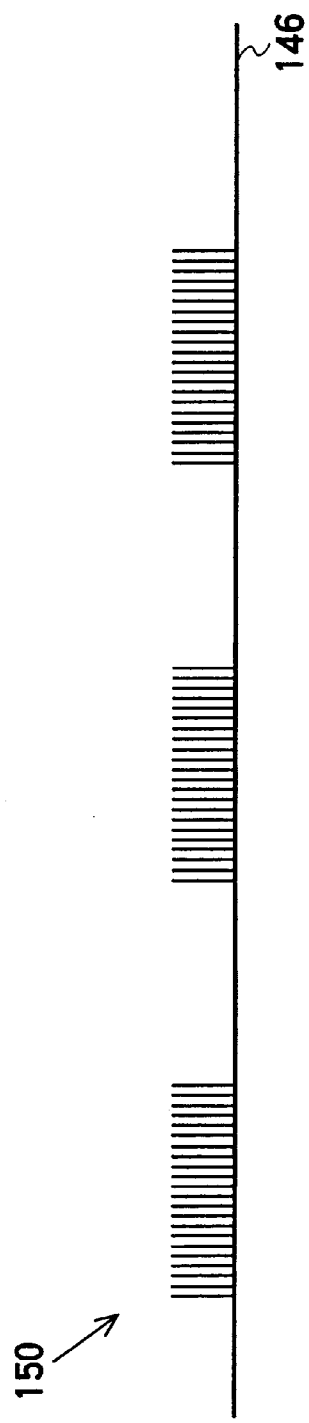
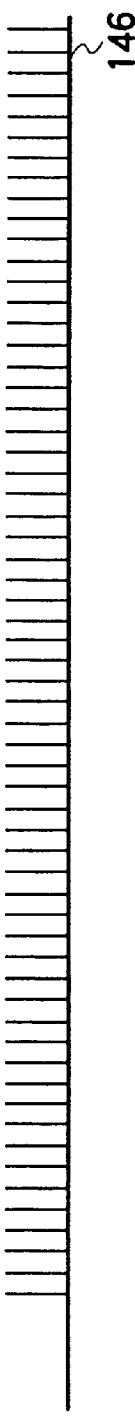
FIG.6(a)
FIG.6(b)
FIG.6(c)

a predetermined delay time.

DELAY CLOCK GENERATING APPARATUS AND DELAY TIME MEASURING APPARATUS

This patent application is a divisional application of U.S. patent application Ser. No. 09/541,910, filed Apr. 3, 2000 U.S. Pat. No. 6,597,753, which claims priority on a Japanese patent application, 1111-95941 filed Apr. 2, 1999, the contents of which are incorporated herein by reference.

BACKGROUND OF THE INVENTION

1. Field of the Invention

The present invention relates to a delay clock generating apparatus which generates a delay clock, and more particularly to a delay clock generating apparatus which is incorporated in a delay signal generator of a semiconductor testing device, which tests a semiconductor device.

2. Description of the Related Art

Recently, it has been necessary for a semiconductor testing device for testing a semiconductor device to control extremely high-speed operational timings, due to developments of semiconductor devices which operate at high-speed. It has been especially necessary that the semiconductor testing device delay timing with respect to a standard clock, for inputting a test pattern to a device under test (DUT), by an accurate delay time, in accordance with an input characteristic of the DUT.

FIG. 1 is a block diagram showing a delay line 176 in the semiconductor testing device, generating a delay indicator signal which is delayed by a predetermined time. The delay line 176 includes delay elements 180, 184, 188 and 192, selectors 182, 186, 190 and 194, and a memory 196. In this delay line 176, a clock is input to an input terminal and the delay indicator signal, which is delayed by a predetermined time with respect to the input clock, is output from an output terminal.

The memory 196 stores data in predetermined addresses, of combinations of the delay elements generating a predetermined delay time. Each of the selectors 182, 186, 190 and 194 selects either of the clocks, one of which is passed through each of the delay elements 180, 184, 188 and 192 and the other of which is not passed through each of the delay elements 180, 184, 188 and 192, and outputs the selected clock. For example, when the delay element 182 uses the delay element 180 in order to generate a predetermined delay time, "0" is stored in the corresponding bit of the memory 196. When, on the other hand, the delay element 182 does not use the delay element 180 in order to generated the predetermined delay time, "1" is stored in the corresponding bit of the memory 196.

Each of the delay elements 180, 184, 188 and 192 in the delay line 176 are set to have delay times of about several picoseconds, several tens of picoseconds, or several hundred picoseconds. Therefore, logically, three delay elements respectively having delay times of 10 picoseconds, 20 picoseconds, and 40 picoseconds should be provided, in order to set seven delay times of 10 picoseconds, 20 picoseconds, . . . , 70 picoseconds. The combinations of the three delay elements provide the seven delay times.

However, actually, errors occur between the actual delay time provided by the delay elements and the set delay time, because the quality of the delay elements are not equal, and delay time provided by the delay elements varies depending on the ambient temperature. It is necessary to determine the optimum combination of the delay elements by measuring the delay time provided by the delay times, in order to give a predetermined delay time.

FIG. 2 is a block diagram of a conventional semiconductor testing device in which an output signal output from a waveform formatter 12, which is delayed with respect to a signal generated by a pattern generator 10, is measured. In this measurement, the pattern generator 10 supplies a standard clock 34 to a timing generator 14 and supplies a measurement signal 32 to the waveform formatter 12 for measuring the delay time. The timing generator 14 includes a plurality of the delay lines 176, shown in FIG. 1, and generates the delay indicator signal 36 which is delayed by a predetermined time with respect to the standard clock 34, based on the arbitrarily selected combinations of the delay elements. The delay indicator signal 36 is supplied to the waveform formatter 12. The waveform formatter 12 delays the measurement signal 32 based on the delay indicator signal 36 and outputs the delayed measurement signal 38 to the oscilloscope 16. The oscilloscope 16 measures the delay time generated by the arbitrarily selected combinations of the delay elements. The data for the combinations of the delay elements are stored in predetermined addresses of the memory 196, shown in FIG. 1.

Conventionally, the delay time generated by the combinations of each of the delay elements is measured by the oscilloscope 16. The combinations of the delay elements and the corresponding data of the delay times are stored in the memory 196. The delay elements which can generate a desired delay time are selected based on the data stored in the memory 196, in accordance with the input characteristic of the semiconductor device when testing the semiconductor device.

Using the conventional method of measuring delay times creates disadvantages, because the delay times are measured by the oscilloscope 16. The oscilloscope 16 cannot measure waveforms output from the waveform formatter 12 corresponding to a plurality of pins of the waveform formatter 12. Furthermore, the oscilloscope 16 cannot measure an accurate delay time when the delay time is very small, for example, approximately several picoseconds, or several tens of picoseconds.

Conventionally, it was difficult to measure an accurate delay time generated by a combination of the delay elements, by measuring a delay clock, because it was difficult to generate the delay clock having an accurate delay time.

SUMMARY OF THE INVENTION

Therefore, it is an object of the present invention to provide a delay time measuring apparatus and a method of measuring delay times, capable of accurately measuring delay times of a plurality of parallel set delay lines.

It is an object of the present invention to provide a method of setting a combination of delay clocks that can generate a predetermined delay time.

It is an object of the present invention to provide a delay clock generating apparatus capable of generating a delay clock having an accurate delay time.

It is further an object of the present invention to provide a delay clock generating apparatus and a method of measuring delay times, which overcomes the above issues in the related art. This object is achieved by combinations described in the independent claims. The dependent claims define further advantageous and exemplary combinations of the present invention.

In order to solve the above-stated problem, the present invention provides a delay clock generating apparatus generating a delay clock which is delayed by a predetermined time with respect to a standard clock, comprising: an oscillator oscillating a shift clock having a same cycle as the standard clock; a pulse inserter generating a pulse to be inserted in a reference shift clock, at least either of an upward shift or a downward shift of the reference shift clock being synchronized with an upward shift or a downward shift of the shift clock, respectively, the pulse inserter inserting the pulse in the reference shift clock; and a phase-lock unit generating the delay clock delayed by the predetermined time with respect to the standard clock, by delaying a phase of the shift clock oscillated by the oscillator with respect to a phase of the standard clock based on a reference standard clock synchronizing the standard clock and having a same cycle as the reference shift clock, and the reference shift clock including the insert-pulse.

The delay clock generating apparatus may further comprise a phase comparator outputting the reference standard clock and the reference shift clock based on a phase difference between a synchronous shift clock synchronizing the shift clock and a synchronous standard clock synchronizing the standard clock and having a same cycle as the synchronous shift clock.

The phase comparator may output the reference standard clock and the reference shift clock such that a downward shift of the reference standard clock and a downward shift of the reference shift clock are matched with each other, based on the synchronous standard clock and the synchronous shift clock.

The pulse inserter may insert the pulse between a downward shift of the reference shift clock and a next upward shift of the reference shift clock.

The pulse inserter may insert the pulse to the reference shift clock such that the pulse is synchronized with the standard clock.

The delay clock generating apparatus may further comprise: a synchronous standard clock generator outputting the synchronous standard clock by frequency dividing the standard clock; and a synchronous shift clock generator outputting the synchronous shift clock by frequency dividing the shift clock such that the synchronous shift clock has a same cycle as the synchronous standard clock.

The delay clock generating apparatus may further comprise a phase controller, generating a phase control signal indicating a cycle to which the pulse is to be inserted among a plurality of cycles of the reference shift clock; and the pulse inserter may insert the pulse to the cycle of the reference shift clock indicated by the phase control signal.

The phase-lock unit may delay a phase of the shift clock oscillated by the oscillator, based on the number of the pulses inserted in the plurality of cycles of the reference shift clock.

The phase-lock unit may comprise: a subtractor outputting an averaged value of a subtraction result, obtained by subtracting an electric potential of pulses of the reference shift clock including the insert-pulse from an electric potential of pulses of the synchronous standard clock; and a pulse width adjuster, adjusting a pulse width of the reference shift clock including the insert-pulse such that the averaged value of the subtraction result by the subtractor becomes zero.

The oscillator may be a ring oscillator by which an oscillation frequency varies in accordance with a source voltage; and the pulse width adjuster adjusts a pulse width of the reference shift clock including the insert-pulse by adjusting the source voltage of the ring oscillator, based on the averaged value of the subtraction result by the subtractor.

The ring oscillator may be mounted on a single chip with a plurality of electronic circuits; and the delay clock generating apparatus may further comprise a source voltage unit, supplying the source voltage adjusted based on the averaged value of the subtraction result, to the plurality of the electronic circuits.

The oscillator may be a voltage control type oscillator by which an oscillation frequency varies based on a controlled voltage; and the pulse width adjuster adjusts a pulse width of the reference shift clock including the insert-pulse by adjusting the controlled voltage of the voltage control type oscillator, based on the averaged value of the subtraction result by the subtractor.

The phase controller may generate the phase control signal such that the pulse is diffusely inserted along a time series of the plurality of cycles in the reference shift clock.

The phase controller may comprise: a counter having M bits (M is a natural number) and increasing an output value based on the synchronous standard clock; a insert-pulse setting register having (M+1) bits and storing numbers of the pulses to be inserted; a plurality of change-point detectors each detecting a change-point of the bits of the counter; and a plurality of AND circuits each logically multiplying a register value corresponding to a (M−n+1) th bit (n is a natural number) of the insert-pulse setting register and an output value of the change-point detector corresponding to a nth bit of the counter; and the phase controller may indicate cycles to which the pulse is to be inserted based on the logical multiplication of the AND circuit.

In order to solve the above-stated problem, the present invention further provides a method of measuring a delay time of a delay line, the delay line comprising an input terminal and an output terminal for a standard clock, the output terminal being connected to a data input of a flip-flop circuit operated by a delay clock having a predetermined delay time with respect to the standard clock, comprising: setting a constant delay time for the delay line; supplying the standard clock to the input terminal of the delay line for which the constant delay time is set; supplying a synchronous delay clock synchronizing the delay clock to a clock input of the flip-flop circuit; averaging output logic values output from the flip-flop circuit; and measuring the constant delay time of the delay line based on averaged output logic values.

The measuring step may judge that the constant delay time of the delay line is equal to the predetermined delay time of the delay clock when the averaged output logic value is almost 0.5.

In order to solve the above-stated problem, the present invention further provides a delay time measuring apparatus measuring a delay time of a delay line, comprising: delay clock generating means generating a delay clock having a predetermined delay time with respect to a standard clock; standard clock supplying means supplying the clock to the delay line; a timing comparator comparing an edge of a delay pulse which is obtained by delaying the standard clock by the delay line and an edge of a synchronous delay clock synchronizing the delay clock, and outputting the compared result as a logic value "0" or "1"; averaging means generating an averaged value of the compared result output from the timing comparator; and measuring means measuring a delay time of the delay line based on the averaged value generated by the averaging means.

The timing comparator may include a flip-flop circuit having a data input to which the delay pulse is input and a clock input to which the synchronous delay clock is input.

The measuring means may judge that the delay time of the delay line is equal to the predetermined delay time of the delay clock when the averaged value is almost 0.5.

This summary of the invention does not necessarily describe all essential features so that the invention may also be a sub-combination of these described features.

BRIEF DESCRIPTION OF THE DRAWINGS

FIG. 6(a) shows an example in which a group of insert-pulses 150 are inserted in the reference shift clock 146;

FIG. 6(b) shows a low frequency ripple in the source voltage, caused by the insertion of the insert-pulses 150;

FIG. 6(c) shows an example in which the insert-pulses 150 are diffusely inserted along the time series of the reference shift clock 146;

FIG. 11 is a timing chart showing timings of the synchronous delay clock 170, and the delay pulses 177(A), 177(B) and 177(C), which are input to the data input of the timing comparator 178a.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 3:
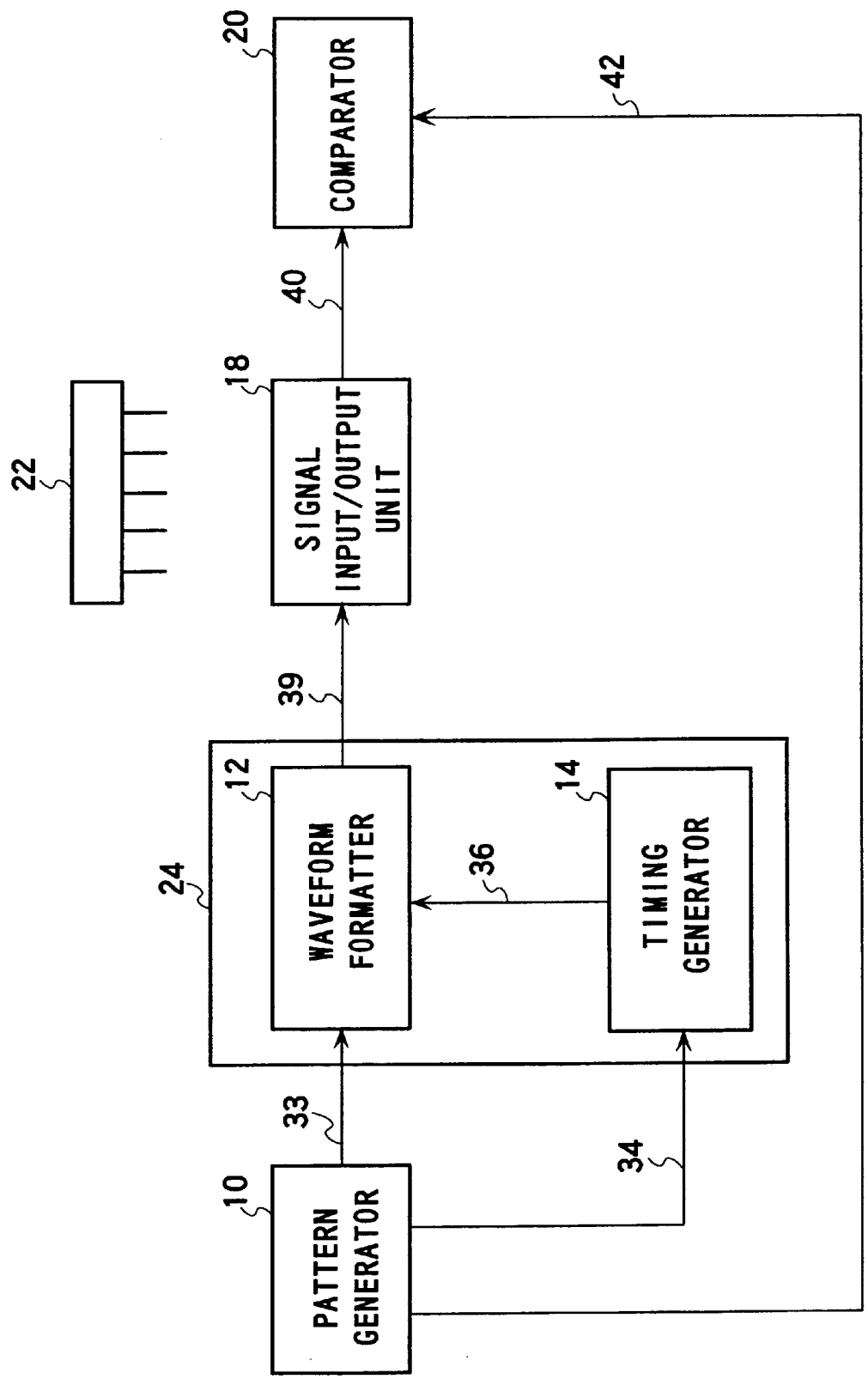
FIG. 3 is a block diagram of the semiconductor testing device for testing the DUT 22.

FIG. 3 is a block diagram of a semiconductor testing device, for testing a device under test (DUT) 22. The semiconductor testing device includes a pattern generator 10, a delay signal generator 24, a signal input/output unit 18 and a comparator 20. The delay signal generator 24 has a waveform formatter 12 and a timing generator 14. The DUT 22 is connected to the signal input/output unit 18 while being tested.

Figure 1:
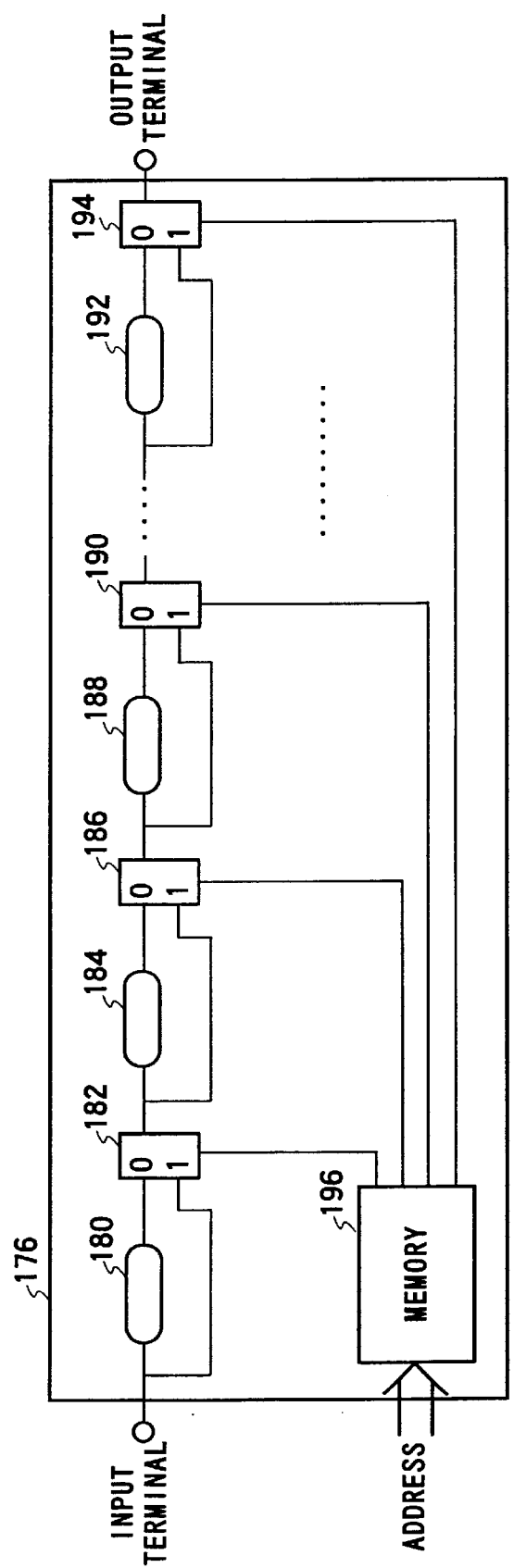
FIG. 1 is a block diagram of an example of the delay line 176 in the semiconductor testing device, that delays a test pattern by a predetermined delay time.
Figure 2:
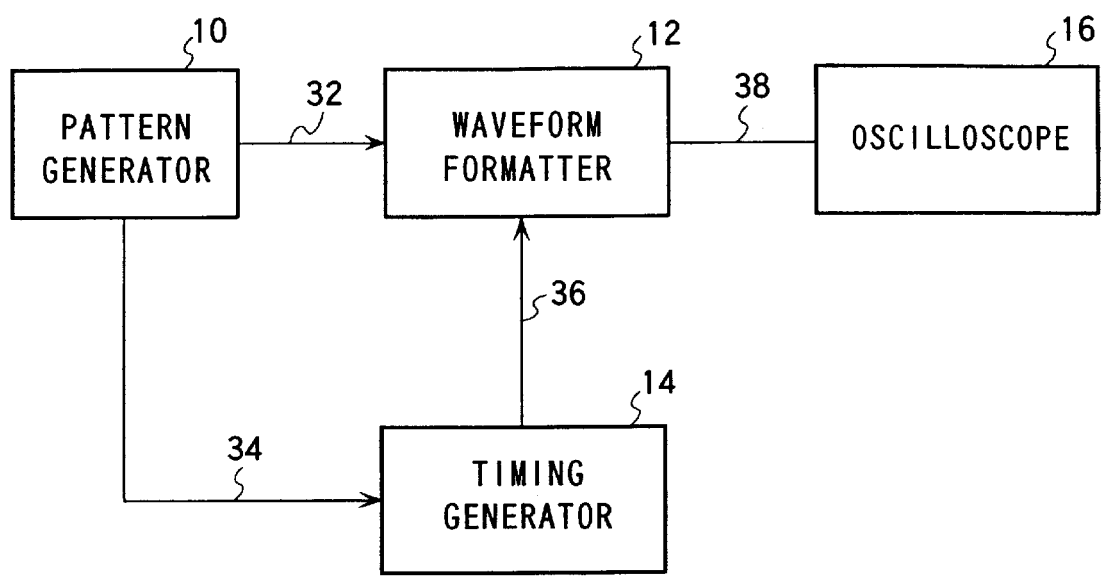
FIG. 2 is a block diagram of a conventional structure of the semiconductor testing device in which an output signal output from the waveform formatter 12 which is delayed with respect to a signal generated by the pattern generator 10 is measured.

The pattern generator 10 generates an input pattern 33 and a standard clock 34 which are to be input to the DUT 22, and supplies them to the delay signal generator 24. The input pattern 33 is input to the waveform formatter 12 and the standard clock 34 is input to the timing generator 14. Inside the timing generator is a delay clock generator, not shown in the drawings, and a delay line, shown in FIG. 1 as 176. Data of combinations of delay elements for generating a predetermined delay time are previously stored in a memory 196 of the delay line 176. The data in this embodiment are obtained based on a delay clock having a predetermined delay time, generated by the delay clock generator.

A delay indicator signal 36, which is delayed by a predetermined time with respect to the standard clock, is input to the waveform formatter 12. The waveform formatter 12 delays the timing of the input pattern 33 to be input to the DUT 22 based on the delay indicator signal 36. The waveform formatter 12 supplies the delay signal 39, which is the delayed input pattern, to the signal input/output unit 18. Although the delay clock generator and the delay line are incorporated in the timing generator in this embodiment, the delay clock generator and the delay line can be incorporated in the waveform formatter 12 in another embodiment. The delay signal generator 24 can output the delay signal 39, which is delayed by a predetermined delay time, in accordance with the input characteristics of the DUT 22, with respect to the input pattern 33.

The DUT 22 receives the delay signal 39 through the signal input/output unit 18 and outputs an output signal 40 to the comparator 20 based on the received delay signal 39. For example, when the DUT 22 is a memory device, the data stored based on the delay signal 39 is output as the output signal 40. When the DUT 22 is an arithmetical unit, the arithmetical result obtained based on the delay signal 39 is output as the output signal 40. The pattern generator 10 outputs to the comparator 20 an expected pattern 42 which should be output from a normal DUT 22 as the output signal 40. The comparator 20 compares the output signal 40 and the expected pattern 42 and judges the quality of the DUT 22.

Figure 4:
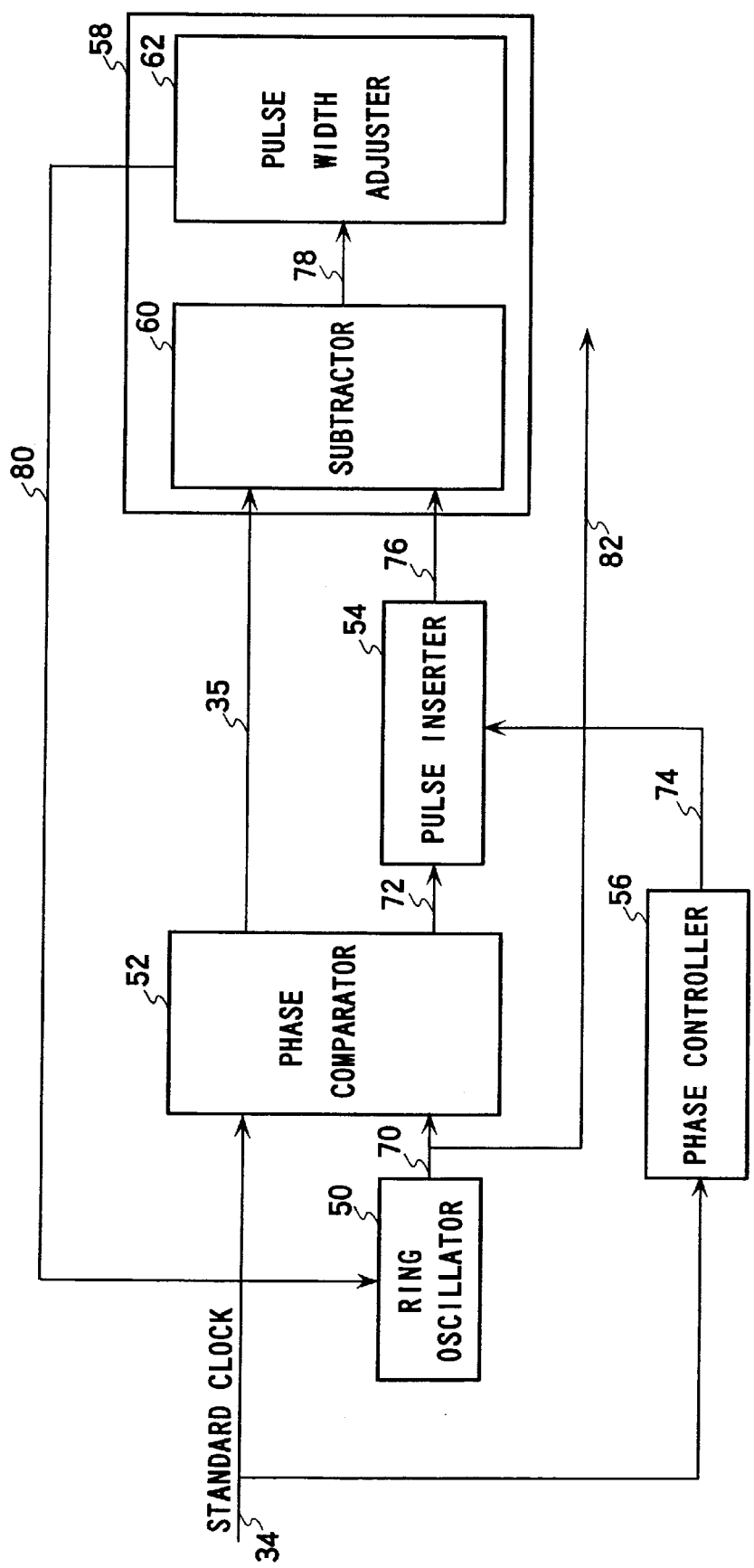
FIG. 4 is a block diagram of an embodiment of the delay clock generating apparatus according to the present invention, generating a delay clock that is delayed by a predetermined time with respect to a standard clock.

FIG. 4 is a block diagram of the delay clock generating apparatus of this embodiment according to the present invention, generating a delay clock which is delayed by a predetermined delay time with respect to a standard clock. The delay clock generating apparatus can be incorporated in the delay signal generator 24 shown in FIG. 3 and is capable of obtaining data to be stored in the memory 196 prior to testing the DUT 22. The delay clock generating apparatus includes a ring oscillator 50, a phase comparator 52, a pulse inserter 54, a phase controller 56, and a phase-lock unit 58. The phase-lock unit 58 has a subtractor 60 and a pulse width adjuster 62.

The standard clock 34 is input to the phase comparator 52 and the phase controller 56. The ring oscillator 50 can oscillate a shift clock 70 having a same cycle as the standard clock 34. The phase comparator 52 compares the phases of the standard clock 34 and the shift clock 70 and respectively outputs a reference standard clock 35 and a reference shift clock 72, based on the phase difference between the standard clock 34 and the shift clock 70. The reference standard clock 35 synchronizes the standard clock 34 and has a same cycle as the reference shift clock 72. At least either the upward shift or the downward shift of the reference shift clock 72 synchronizes with the upward shift or the down ward shift of the shift clock 70. The reference shift clock 72 is supplied to the pulse inserter 54.

The phase controller 56 receives the standard clock 34 and generates a phase control signal 74 indicating cycles to which the insert-pulses are respectively inserted among a plurality of cycles of the reference shift clock 72. Preferably, the phase controller 56 generates the phase control signal 74 such that the insert-pulses are diffusely inserted along time series of the plurality of cycles of the reference shift clock 72. The pulse inserter 54 can generate insert-pulses to be inserted into the reference shift clock 72 and respectively insert the insert-pulses to the cycles of the reference shift clock 72 indicated by the phase control signal 74. The pulse inserter 54 may serve as a pulse width extender, extending the pulse width (pulse duration) of the reference shift clock 72. Each of the pulses is inserted between the downward shift of one of the reference shift clocks 72 and the upward shift of the next reference shift clock 72. The pulse inserter 54 outputs to the phase-lock unit 58, a reference shift clock 76 including the insert-pulses.

The phase-lock unit 58 has the ring oscillator 50 generate a delay clock 82 having a predetermined delay time with respect to the standard clock 34, by delaying the phase of the shift clock 70 oscillated by the ring oscillator with respect to the phase of the standard clock 34, based on the reference standard clock 35 and the reference shift clock 76 including the insert-pulses. In other words, the phase-lock unit 58 can delay the phase of the shift clock 70 oscillated by the ring oscillator 50, based on the numbers of insert-pulses inserted in the plurality of cycles of the reference shift clock 72 and the pulse width of the insert-pulses. The phase-lock unit 58 in this embodiment includes a subtractor 60 and a pulse width adjuster 62. The subtractor 60 can output an averaged subtraction result, which is obtained by subtracting the electric potential of the pulses of the reference shift clock 76 including the insert-pulses, from the electric potential of the pulses of the reference standard clock 35, and averaging the subtracted result.

When the averaged subtraction result 78 is zero, it means that the shift clock 70 oscillated by the ring oscillator 50 is a delay clock, which is delayed by a predetermined time with respect to the standard clock 34. When, on the other hand, the averaged subtraction result 78 is not zero, it means that the shift clock 70 oscillated by the ring oscillator 50 does not have a predetermined delay time with respect to the standard clock 34. The pulse width adjuster 62 adjusts the oscillation frequency of the ring oscillator 50 such that the averaged subtraction result from the subtractor 60 becomes zero. It means that the pulse width adjuster 62 continuously adjusts the pulse width of the reference shift clock 76 by adjusting the oscillation frequency of the ring oscillator 50, until the averaged subtraction result 78 from the subtractor 60 becomes zero. When the ring oscillator 50 varies the oscillation frequency in accordance with the source voltage, the pulse width adjuster 62 may output a voltage-adjusting signal 80, adjusting the source voltage of the ring oscillator 50 based on the averaged subtraction result 78 from the subtractor 60, to adjust the pulse width of the reference shift clock 76.

Although the oscillator 50 in this embodiment is described as a ring oscillator, in another embodiment the oscillator may be a voltage controlled type oscillator by which the oscillation frequency varies in accordance with the controlled voltage. At this time, the pulse width adjuster 62 may adjust the pulse width of the reference shift clock 76 including the insert-pulses, by adjusting the controlled voltage of the voltage controlled type oscillator, based on the averaged subtraction result 78 from the subtractor 60.

As described above, when the averaged subtraction result 78 from the subtractor 60 becomes zero in the delay clock generating apparatus shown in FIG. 4, i.e., when the total length of the pulse width of the standard clock 34 having predetermined cycles becomes equal to the total length of the pulse width of the reference shift clock 76 including the insert-pulses, it means that the ring oscillator 50 oscillates the delay clock 82 having a predetermined delay time. The ring oscillator 50 becomes capable of continuously oscillating the delay clock 82 having a predetermined delay time, by locking the conditions of each of the elements.

Figure 5:
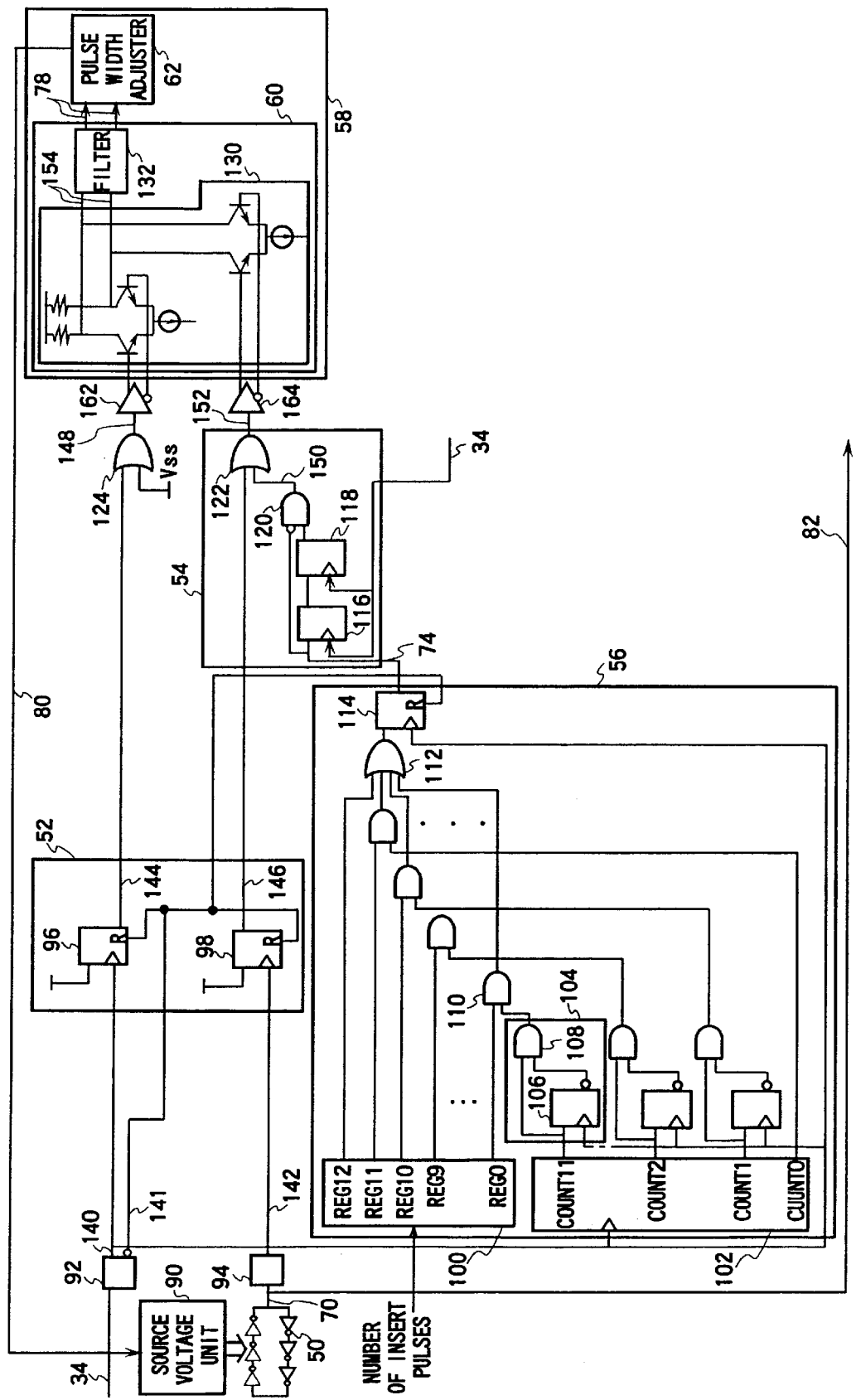
FIG. 5 is a structure of the circuit showing an embodiment of the delay clock generating apparatus according to the present invention, generating a delay clock that is delayed by a predetermined time with respect to a standard clock.

FIG. 5 is a structure of the circuit, showing an example of the delay clock generating apparatus according to the present invention, generating a delay clock which is delayed by a predetermined delay time with respect to a standard clock. The structure of the circuit shown in FIG. 5 is same as the block diagram shown in FIG. 4. The elements in FIG. 5 having same symbols as those shown in FIG. 4 have same functions and operations as those shown in FIG. 4. The delay clock generating apparatus shown in FIG. 5 includes the ring oscillator 50, the phase comparator 52, the pulse inserter 54, the phase controller 56, the delay phase-lock unit 58, a source voltage unit 90, a synchronous standard clock generator 92, a synchronous shift clock generator 94, an OR gate 124 and drivers 162 and 164.

The synchronous standard clock generator 92 outputs a synchronous standard clock 140 synchronizing the input standard clock 34, based on the standard clock 34. Similarly, the synchronous shift clock generator 94 outputs a synchronous shift clock 142 synchronizing the shift clock 70, based on the shift clock 70. The synchronous standard clock 140 and the synchronous shift clock 142 have the same cycles. In this embodiment, both the synchronous standard clock generator 92 and the synchronous shift clock generator 94 are eighth-frequency-dividers that divide the frequency of the input signals by eight. However, the synchronous standard clock generator 92 and the synchronous shift clock generator 94 are not limited to the eighth-frequency-dividers and may be quarter-frequency-dividers that divide the frequency of the input signals by four, half-frequency-dividers that divide the frequency of the input signals by two, or first-frequency-dividers that divide the frequency of the input signals by one. The first-frequency-divider may be a buffer. The synchronous shift clock generator 94 is provided for extending the parts of the reference shift clock 146 having logic value zero and to which the input pulses 150 are inserted. Therefore, when the pulses 150 can be inserted in the parts of the original shift clock 70 having a logic value zero, the synchronous shift clock generator 94 may not be necessary or may be merely a buffer.

The source voltage unit 90 supplies source voltage to the ring oscillator 50 in order to drive the ring oscillator 50. The phase comparator 52 has flip-flop circuits (FF) 96 and 98. The pulse inserter 54 has two flip-flop circuits (FF) 116 and 118, an AND gate 120 and an OR gate 122. The ring oscillator 50 may be constructed on a single chip, along with a plurality of electronic circuits such as the phase comparator 52 and the pulse inserter 54.

The phase controller 56 includes an insert-pulse setting register 100, a counter 102, a plurality of change-point detectors 104, a plurality of AND gates 110, an OR gate 112, and a flip-flop circuit (FF) 114. The counter 102 is an M-bit counter (M is a natural number). The counter 102 in this embodiment is a 12-bit counter having a least significant bit "COUNT 0" to a most significant bit "COUNT 11". The insert-pulse setting register 100 is an (M+1)-bit register storing numbers of the pulses to be inserted by the pulse inserter 54. The insert-pulse setting register 100 in this embodiment is a 13-bit register having a least significant bit "REG 0" to a most significant bit "REG 12".

The change-point detector 104 includes a flip-flop circuit (FF) 106 and an AND gate 108 and is capable of detecting the change-point of the counter 102. In this example, the change-point detector 104 is provided to each of the bits "COUNT 1" to "COUNT 11" of the counter 102. The AND gate 110 outputs a logical multiplication of the register value from the (M−n+1) th bit (n is a natural number) of the insert-pulse setting register 100 and the output value from the change-point detector 104 corresponding to the nth bit of the counter 102. In the phase controller 56 shown in FIG. 5, bits of "REG 0" and "COUNT 11", "REG 1" and "COUNT 10", "REG 2" and "COUNT 9", "REG 3" and "COUNT 8", "REG 4" and "COUNT 7", "REG 5" and "COUNT 6", "REG 6" and "COUNT 5", "REG 7" and "COUNT 4", "REG 8" and "COUNT 3", "REG 9" and "COUNT 2", "REG 10" and "COUNT 1", and "REG 11" and "COUNT 0" are respectively corresponding to each other. The OR gate 112 outputs a logical addition of the outputs from the plurality of AND gates 110 and the bit value of the "REG 12". The output from the OR gate 112 is supplied to the FF 114. The FF 114 supplies a phase control signal 74 to the pulse inserter 54, indicating the timing at which the insert-pulse is inserted.

The phase-lock unit 58 includes the subtractor 60 and the pulse width adjuster 62. The subtractor 60 has a subtracting circuit 130 and a filter 132. The subtracting circuit 130 subtracts one input from the other input, from among the two inputs, to give a subtraction result. The filter 132 averages the subtraction result and supplies the averaged subtraction result to the pulse width adjuster 62. The pulse width adjuster 62 adjusts the phase of the shift clock 70 by adjusting the source voltage of the source voltage unit 90.

The operation of each of the elements used for generating the delay clock 82 will be explained in the following.

The frequency of the standard clock 34 having a frequency of 266 MHz is divided by eight by the synchronous standard clock generator 92. The synchronous standard clock 140, which is an eighth subharmonic of the standard clock 34 and synchronizes the standard clock 34, is input to a clock input of the FF 96. The ring oscillator 50 that varies the oscillation frequency in accordance with the source voltage, oscillates the shift clock 70 having the same cycle as the standard clock 34, based on the source voltage supplied from the source voltage unit 90. The frequency of the shift clock 70 is divided by eight by the synchronous shift clock generator 94. The synchronous shift clock 142, which is the eighth subharmonic of the shift clock 70 and synchronizes the shift clock 70, is input to a clock input of the FF 98. The synchronous standard clock 140 and the synchronous shift clock 142 have the same cycle as each other.

Although the frequencies of the standard clock 34 and the shift clock 70 are divided by eight by the synchronous standard clock generators 92 and 94, respectively, the frequencies of the standard clock 34 and the shift clock 70 may be divided by other numbers or may not be divided, in another embodiment. In this embodiment, "synchronous standard clock" means that the upward shift of the clock synchronizes the upward shift of the standard clock 34 and "synchronous shift clock" means that the upward shift of the clock synchronizes the upward shift of the shift clock 70. For example, in an embodiment where the synchronous standard clock generators 92 and 94 are not included, the synchronous standard clock 140 may itself be the standard clock 34 and the synchronous shift clock 142 may itself be the shift clock 70.

A reversed synchronous standard clock 141, obtained by reversing the synchronous standard clock 140, is input to an R input of each of the FF 96 and the FF 98. The FF 96 and the FF 98 are reset at the timing of the upward shift of the reversed synchronous standard clock 141, i.e., at the timing of the downward shift of the synchronous standard clock 140. Therefore, the downward shift of the synchronous shift clock 142 can be matched with the downward shift of the synchronous standard clock 140. The phase comparator 52 outputs a reference standard clock 144 and a reference shift clock 146 whose downward shifts are matched with each other based on the phase difference between the synchronous standard clock 140 and the synchronous shift clock 142. It means that the FF 96 outputs the reference standard clock 144 and the FF 98 outputs the reference shift clock 146 having a shortened pulse in accordance with the phase difference between the synchronous standard clock 140 and the synchronous shift clock 142. In this example, the synchronous standard clock 140 and the reference standard clock 144 have the same pulse train.

The insert-pulse setting register 100 stores the numbers of pulses to be inserted by the pulse inserter 54. It means that the insert-pulse setting register 100 previously stores data indicating how many pulses are inserted to the reference shift clock 146 having 4096 cycles (12 bits). The delay time of the delay clock 82, with respect to the standard clock 34, is determined by the number of pulses whose data is stored in the insert-pulse setting register 100. This will be explained in detail later.

The counter 102 is a 12-bit counter, and increases the output value based on the synchronous standard clock 140, which is the eighth subharmonic of the standard clock 34. Change-point detectors 104 are provided to the "COUNT 1" to "COUNT 11", although the change-point detector 104 is shown in FIG. 5 as being connected only with the "COUNT 11", to simplify the explanation. Furthermore, although the change-point detector 104 is not provided to the "COUNT 0" in the example shown in FIG. 5, the change-point detector 104 may be provided to the "COUNT 0" in another example.

The change-point detector 104 can detect the change point, where the bit of the counter 102 changes. Change-point detectors 104 are provided to the "COUNT 1" to "COUNT 11". The operation of the change-point detector 104 provided to the "COUNT 11" will be explained in the following.

The output from the "COUNT 11" is input to a data input of the FF 106. The synchronous standard clock 140, which is the eighth subharmonic of the standard clock 34, is input to a clock input of the FF 106. The output from the FF 106 is reversed and input to one of the input gates of the AND gate 108. The output from the "COUNT 11" is input to the other of the input gates of the AND gate 108. Therefore, when the output from the "COUNT 11" varies from a logic value "0" to a logic value "1" based on the synchronous standard clock 140, the AND gate 108 outputs the logic value "1". The change-point detectors 104 provided to the "COUNT 1" to "COUNT 10" give the same functions.

The phase controller 56 shown in FIG. 5 does not include the change-point detector 104 next to the "COUNT 0". This is because the change-point detector 104 only detects the change-point where the output value of the bit from the counter 102 varies from the logic value "0" to the logic value "1", therefore, it is not necessary for the "COUNT 0" from which the logic values "0" and "1" are alternately outputted to have the change-point detector 104. Therefore, it can be said that the "COUNT 0" originally includes a change-point detector 104 next to it. However, the change-point detector 104 may be provided to the "COUNT 0" in the same way as the "COUNT 1" to the "COUNT 11".

When a group of insert-pulses are inserted in the plurality of cycles (4096 cycles [12 bits] of the reference shift clock 146 in this embodiment) by the pulse inserter 54, a low frequency ripple may be generated in the source voltage. Therefore, it is desirable to diffusely insert the insert-pulses along time series of the plurality of cycles of the reference shift clock 146.

In order to diffusely insert the insert-pulses along time series of the plurality of cycles of the reference shift clock 146, the AND gate 110 of the phase controller 56 outputs the logical multiplication of the register value of the (M−n+1) th (n is a natural number) bit of the insert-pulse setting register 100 and the output value of the change-point detector 104 corresponding to the nth bit of the counter 102. It means that the output of the REG (12−n) (n: 1<n<12) of each of the insert-pulse setting registers 100 is respectively input to one of the inputs of each of the AND gates 110. It also means that the output of each of the change-point detectors 104 corresponding to the COUNT (n−1) of each of the counters 102 or the output of the "COUNT 0" is respectively input to the other of the inputs of each of the AND gates 110. When the output of the REG (12−n), and output of the change-point detector 104 corresponding to the COUNT (n−1) or the output of the "COUNT 0" have logic values "1", the AND gate 110 outputs a logic value "1". The output of the AND gate 110 is input to the OR gate 112. The output of the REG 12 is directly input to the OR gate 112. In this embodiment, when 4096 (#1000000000000) pulses are input to the 4096 cycles, the register value of the REG 12 becomes "1". The OR gate 112 outputs the logical addition of the outputs from all of the AND gates 110 and the register value of the REG 12, and supplies the logical addition to a data input of the FF 114. The timing at which the insert-pulses are set by this structure will be explained later, with reference to FIG. 7.

The synchronous standard clock 140, which is the eighth subharmonic of the standard clock 34, is input to a clock input of the FF 114. The reversed synchronous standard clock 141, which is obtained by reversing the synchronous standard clock 140, is input to a reset (R) input of the FF 114. The FF 114 outputs a phase control signal 74, which indicates the cycles of the reference shift clock 146 to which the insert-pulses are inserted, based on the synchronous standard clock 140, reversed synchronous standard clock 141, and the output of the OR gate 112 to the pulse inserter 54.

The phase control signal 74 is input to a data input of the FF 116 of the pulse inserter 54. The data output from the FF 116 is input to a data input of the FF 118. The standard clock 34 having a frequency of 266 MHz is input to clock inputs of the FF 116 and the FF 118. Both the FF 116 and the FF 118 are operated by the standard clock 34. The data output from the FF 118 is input to one of the input terminals of the AND gate 120. The phase control signal 74 is reversed and input to the other of the input terminals of the AND gate 120.

The AND gate 120 logically multiplies the reversed phase control signal 74 and the data output from the FF 118 and outputs insert-pulses 150. The insert-pulses 150 can be inserted between the downward shift and the next upward shift of the reference shift clock 146, when the pulse inserter 54 is constructed as above. The AND gate 120 outputs the insert-pulses 150 having a plurality of pulses, each shifting upward at the timing when the reference shift clock 146 shifts downward, maintaining a logic value "1" for two cycles of the standard clock 34 having a frequency of 266 MHz, and then shifting downward. The pulse inserter 54 extends the pulse width of the reference shift clock 146, in this embodiment. In another embodiment, the pulse inserter 54 may insert insert-pulses which do not shift upward at the same timing as the downward shift of the reference shift clock 146, between the downward shift and the next upward shift of the reference shift clock 146.

The OR gate 122 logically adds the reference shift clock 146 and the insert-pulses 150, to insert the insert-pulses 150 to the reference shift clock 146. The OR gate 122 outputs the reference shift clock 152 including the insert-pulses 150, to the driver 164. The driver 164 differentially outputs the reference shift clock 152 to the subtracting circuit 130. Similarly, the reference standard clock 144 is supplied to the OR gate 124. The OR gate 124 then outputs the reference standard clock 148 to the driver 162. The reference standard clock 144 and the reference standard clock 148 have the same pulse train.

The subtracting circuit 130 subtracts the electric potential of the pulse train of the reference shift clock 152 including the insert-pulses 150, from the electric potential of the pulse train of the reference standard clock 148. The subtraction result 154 obtained by subtraction using the subtracting circuit 130, is averaged by filtering using the filter 132. The filter 132 outputs the averaged subtraction result 78 to the pulse width adjuster 62. The averaged value of the subtraction result 78 relates to the phase difference between the standard clock 34 and the shift clock 70, and the pulse width and number of pulses of the insert-pulse 150.

When the averaged value of the subtraction result 78 is zero, it means that the delay clock 82 has a desired delay time with respect to the standard clock 34. When, on the other hand, the value of the subtraction result 78 is not zero, it means that the delay clock 82 does not have a desired delay time, therefore, it is necessary to change the oscillation frequency of the ring oscillator 59, to adjust the pulse width of the reference shift clock 152. The pulse width adjuster 62 generates the voltage-adjusting signal 80 based on the subtraction result 78, for adjusting the source voltage of the source voltage unit 90. The source voltage unit 90 adjusts the source voltage to be supplied to the ring oscillator 50, based on the voltage adjusting signal 80 for adjusting the frequency of the shift clock 70. It means that the pulse width of the reference shift clock 152 is adjustable. The phase-lock unit 58 continuously adjusts the source voltage unit 90 until the subtraction result 78 becomes zero, and then locks the condition when the subtraction result 78 is zero. Therefore, a delay clock having a predetermined delay time can be generated.

When the ring oscillator 50 is mounted on a single chip with a plurality of electronic circuits, it is desirable to provide a source voltage supplier, not shown in the drawings, that supplies the adjusted source voltage, based on the averaged value of the subtraction result, to the plurality of electronic circuits as well. By supplying the adjusted source voltage to the electronic circuits mounted on the same chip, compensation for the timing error caused by the temperature changes or source variation is possible.

FIGS. 6(a) to 6(c) show the insert-pulses 150 to be inserted in the reference shift clock 146. In order to simplify the explanation, pulses of the reference shift clock 146 are not shown, and only pulses of the insert-pulses 150 are shown in FIGS. 6(a) to 6(c).

FIG. 6(a) shows an example in which a group of insert-pulses 150 are inserted in the reference shift clock 146. FIG. 6(b) shows a low frequency ripple in the source voltage, caused by the insertion of the insert-pulses 150. The source voltage varies because of the ripple generated in the source voltage. This prevents the stable supply of voltage, which is undesirable in generating a delay clock having an accurate delay time.

FIG. 6(c) shows an example in which the insert-pulses 150 are diffusely inserted along the time series of the reference shift clock 146. The ripple shown in FIG. 6(b) is not generated in the source when the insert-pulses 150 are diffusely inserted. Thus, a stable voltage can be supplied. Therefore, in order to generate a delay clock having an accurate delay time, it is desirable to diffusely insert the insert-pulses 150.

Figure 7:
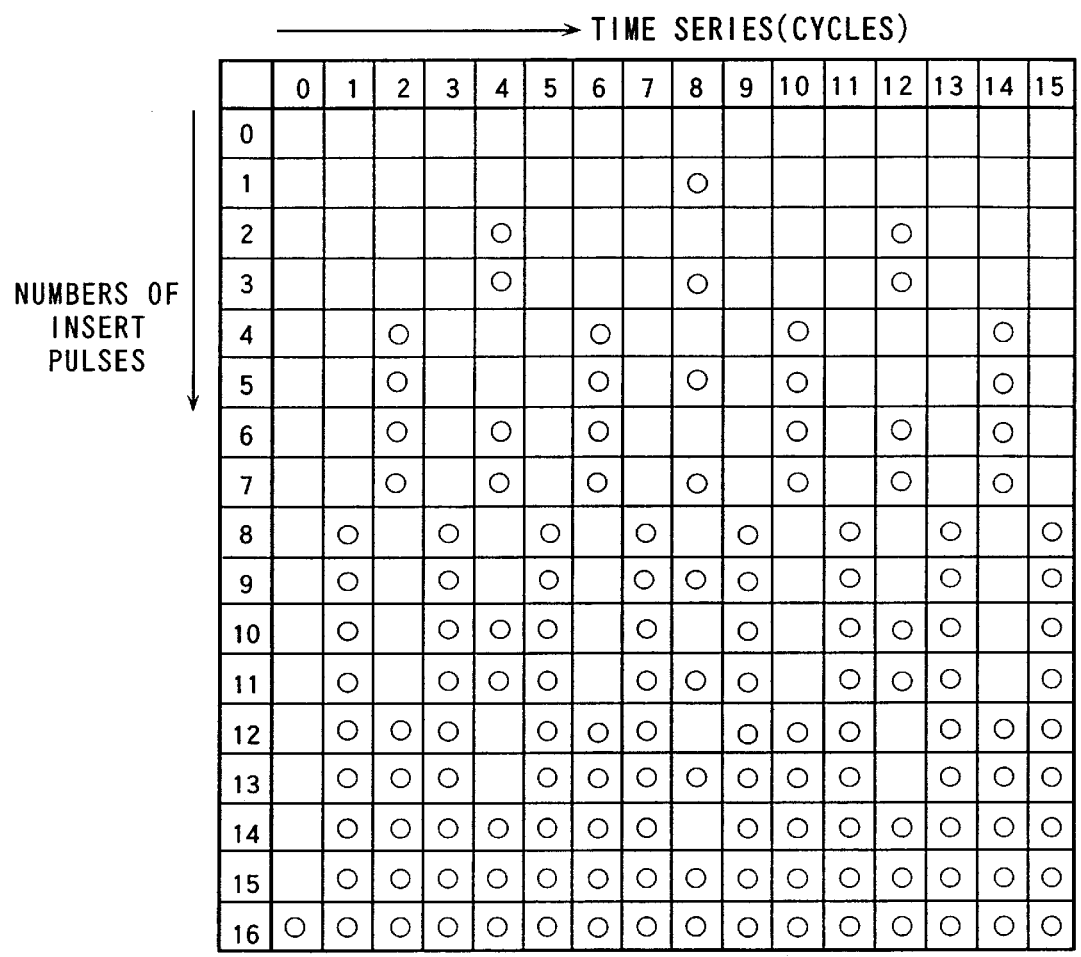
FIG. 7 shows an example of cycles to which the insert-pulses 150 are inserted by the phase controller 56 shown in FIG. 5.

FIG. 7 shows an example of the cycles to which the insert-pulses are inserted, among the plurality of cycles of the phase control signal 74 generated by the phase controller 56 shown in FIG. 5. In order to simplify the explanation, the timing of insertion of the insert-pulses to a shift clock having 16 cycles will be explained. It means that the insert-pulse setting register 100 in this example is a 5-bit register having the least significant bit "REG 0" to the most significant bit "REG 4". The counter 102 is a 4-bit counter having the least significant "COUNT 0" to the most significant "COUNT 3". In this case, the "REG 0" and the "COUNT 3", the "REG 1" and the "COUNT 2", the "REG 2" and the "COUNT 1", and the "REG 3" and the "COUNT 0" are respectively corresponding to each other as explained with reference to FIG. 5.

The columns in FIG. 7 show the number of pulses to be inserted and the rows in FIG. 7 show the time series (cycles). A circle in the table means that the pulse is inserted at the corresponding cycle. As shown in FIG. 7, the phase controller 56 in this embodiment, can diffusely insert pulses along the time series. When 16 pulses are inserted in all of the 16 cycles, i.e., the number of pulses to be inserted is set for 16 (#10000), the value "1" is stored in the "REG 4". It also means that the pulses are always inserted in the shift clock. It is desirable to set the number of bits for the insert-pulse setting register 100 larger than the number of bits for the counter 102 by one, in order to have the pulses inserted in all of the cycles.

Figure 8:
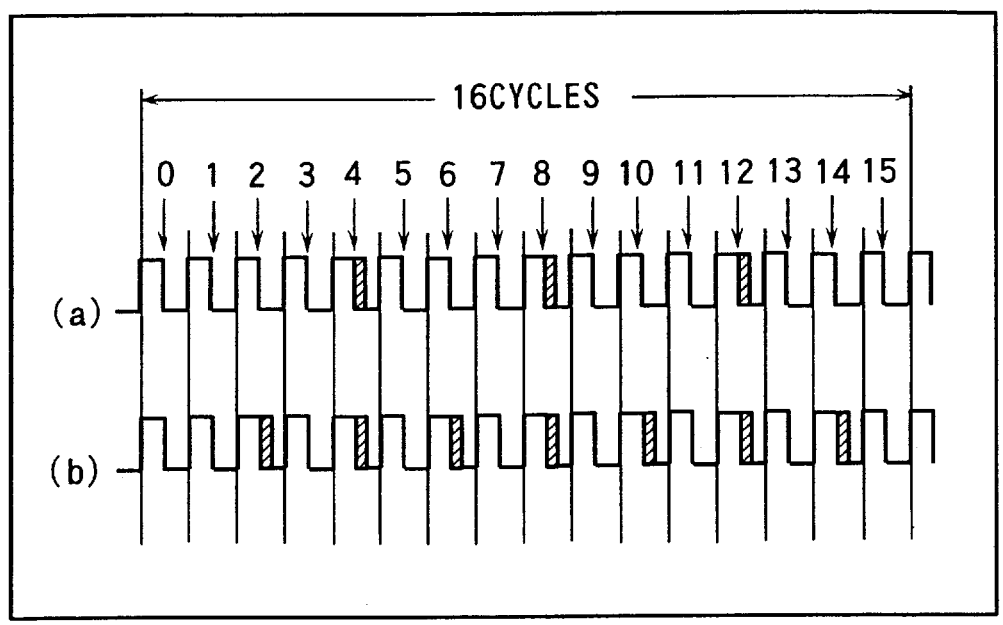
FIG. 8 shows a shift clock to which the pulses are inserted, in accordance with the cycles shown in FIG. 7.

FIG. 8 shows a shift clock to which the pulses are inserted, in accordance with the cycles shown in FIG. 7. FIG. 8(a) shows the shift clock having 16 cycles to which three pulses are inserted, as the number of pulses to be inserted is set for three. The insert-pulses are indicated by hatching in FIG. 8(a). The pulses are inserted in the fourth, eighth and twelfth cycles among the 16 cycles. FIG. 8(b) shows the shift clock having 16 cycles to which seven pulses are inserted, as the number of pulses to be inserted is set for seven. The pulses are inserted in the second, fourth, sixth, eighth, tenth, twelfth and fourteenth cycles among 16 cycles.

Figure 9:
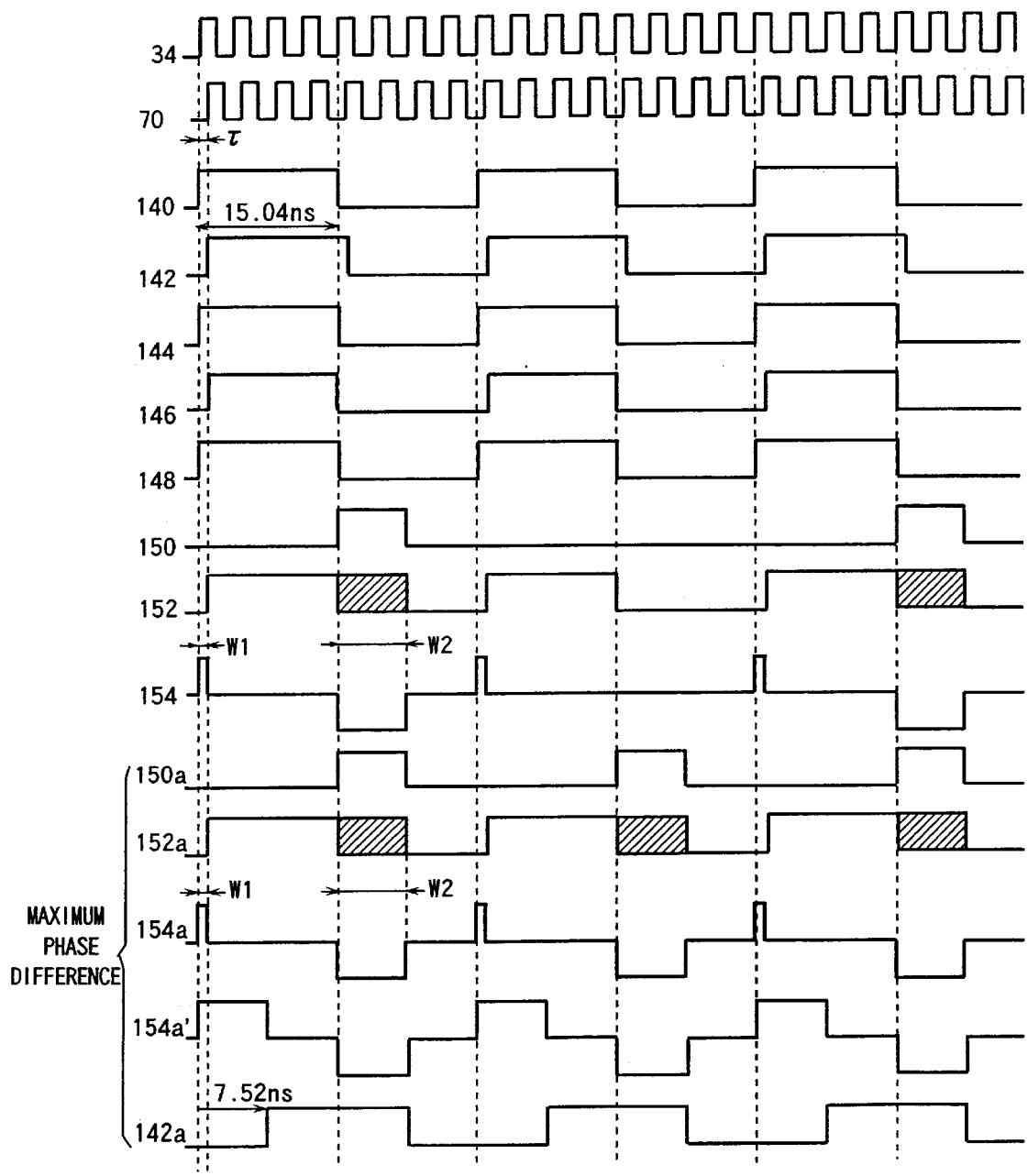
FIG. 9 is a timing chart showing each of the signals shown in FIG. 5.

FIG. 9 shows timing charts of each signal shown in FIG. 5. The operation of each of the elements relating to FIGS. 5 and 9 will be explained in the following.

The standard clock 34 having a frequency of 266 MHz (a cycle of 3.76 ns) is input to the synchronous standard clock generator 92. The ring oscillator 50 oscillates the shift clock 70 having the same cycle as the standard clock 34. In the example shown in FIG. 9, the shift clock 70 is delayed by the time τ with respect to the standard clock 34. The standard clock 34 and the shift clock 70 are respectively input to the synchronous standard clock generators 92 and 94. The synchronous standard clock generators 92 and 94 respectively divide the frequencies of the standard clock 34 and the shift clock 70 by eight. The synchronous standard clock 140 and the synchronous shift clock 142, which divide by eight the frequencies of the standard clock 34 and the shift clock 70, respectively have cycles of 30.08 ns.

The synchronous standard clock 140 and the synchronous shift clock 142 are input to the phase comparator 52. The downward shift of the synchronous shift clock 142 is matched with the downward shift of the synchronous standard clock 140. The reference shift clock 146 output from the phase comparator 52 has a pulse whose period having the logic value "1" becomes shortened by time τ, with respect to the reference standard clock 144. The reference standard clock 144 is supplied through the OR gate 124 to the driver 162, as the reference standard clock 148. The reference standard clock 148 is supplied to the subtracting circuit 130 from the driver 162.

The pulse inserter 54 generates the insert-pulses 150 based on the standard clock 34. The insert-pulses 150 are pulses whose period having the logic value "1" is twice the cycle of the standard clock 34 (7.52 ns). The reference shift clock 146 downward shift is matched with the downward shift of the synchronous standard clock 140, and insert-pulses 150 are input to the OR gate 122. The OR gate 122 logically adds the reference shift clock 146 and the insert-pulses 150. Each of the pulses of the insert-pulses 150 is inserted between the downward shift and the next upward shift of the reference shift clock 146. The OR gate 122 outputs to the driver 164 the reference shift clock 152 including the insert-pulses 150. The reference shift clock 152 is supplied to the subtracting circuit 130 from the driver 164.

The subtracting circuit 130 logically subtracts the reference shift clock 152 from the reference standard clock 148. The subtracting circuit 130 outputs the subtraction result 154 to the filter 132. The filter 132 averages the subtraction result and outputs the averaged subtraction result 78 to the pulse width adjuster 62. The pulse width adjuster 62 adjusts the oscillation frequency of the ring oscillator 50 by adjusting the source voltage of the source voltage unit 90, in order to make the subtraction result 78 zero.

As shown in the timing chart of the subtraction result 154, the pulse width based on the phase difference between the standard clock 34 and the shift clock 70 is set as "w1" and the pulse width of each of the insert-pulses is set as "w2". In this embodiment, "w1" is τ and "w2" is 7.52 ns. When the number of insert-pulses to be inserted is set for N, the output from the filter 132 is in a proportional relationship to the following formula:

$$(w1 \times 4096 (\text{cycles})) - (w2 \times N) \tag{1}$$

This means that the pulse width adjuster 62 adjusts the pulse width of "w1" by adjusting the oscillation frequency of the ring oscillator 50, in order to have the value of the formula (1) become zero. Therefore, the delay clock 82 is generated by giving a predetermined delay time to the shift clock 70.

The case in this embodiment in which the insert-pulses 150a are inserted to whole cycles (4096 cycles) of the reference shift clock 146 to give the maximum phase difference, will be explained in the following.

The insert-pulses 150a are inserted in the reference shift clock 146. The insert-pulse 150a is a pulse train, having pulses at every part of the reference shift clock 146 having a logic value "0". The reference shift clock 146 and the insert-pulses 150a are logically added by the OR gate 122. The OR gate 122 outputs to the driver 164 the reference shift clock 152a including the insert-pulses 150a. The reference shift clock 152a is logically subtracted from the reference standard clock 148 by the subtracting circuit 130. The subtracting circuit 130 outputs the subtraction result 154a.

Referring to formula (1), "w2" is 7.52 ns and N is 4096 at this time. The pulse width adjuster 62 adjusts the ring oscillator 50, so that the subtraction result 78 obtained by averaging the subtraction result 154a is zero. When the subtracting circuit 130 outputs the subtraction result 154a' having pulses whose pulse widths w1 are 7.52 ns, the averaged subtraction result 78 becomes zero. The ring oscillator 50 oscillates the synchronous shift clock 142a having a delay time (maximum phase difference) of 7.52 ns.

As described above, the delay clock generating apparatus of this embodiment can accurately generate a delay clock having a predetermined delay time, in accordance with the number of insert-pulses inserted in the predetermined cycles (4096 cycles) Although all of the insert-pulses 150 in this embodiment have the same pulse width, the pulse width for each of the insert-pulses 150 can be adjusted to generate a delay clock having a predetermined delay time. For example, a delay clock having a desired delay time can be generated by inserting into every cycle of the reference shift clock 146, insert-pulses 150 having a pulse width equal to the desired delay time.

Figure 10:
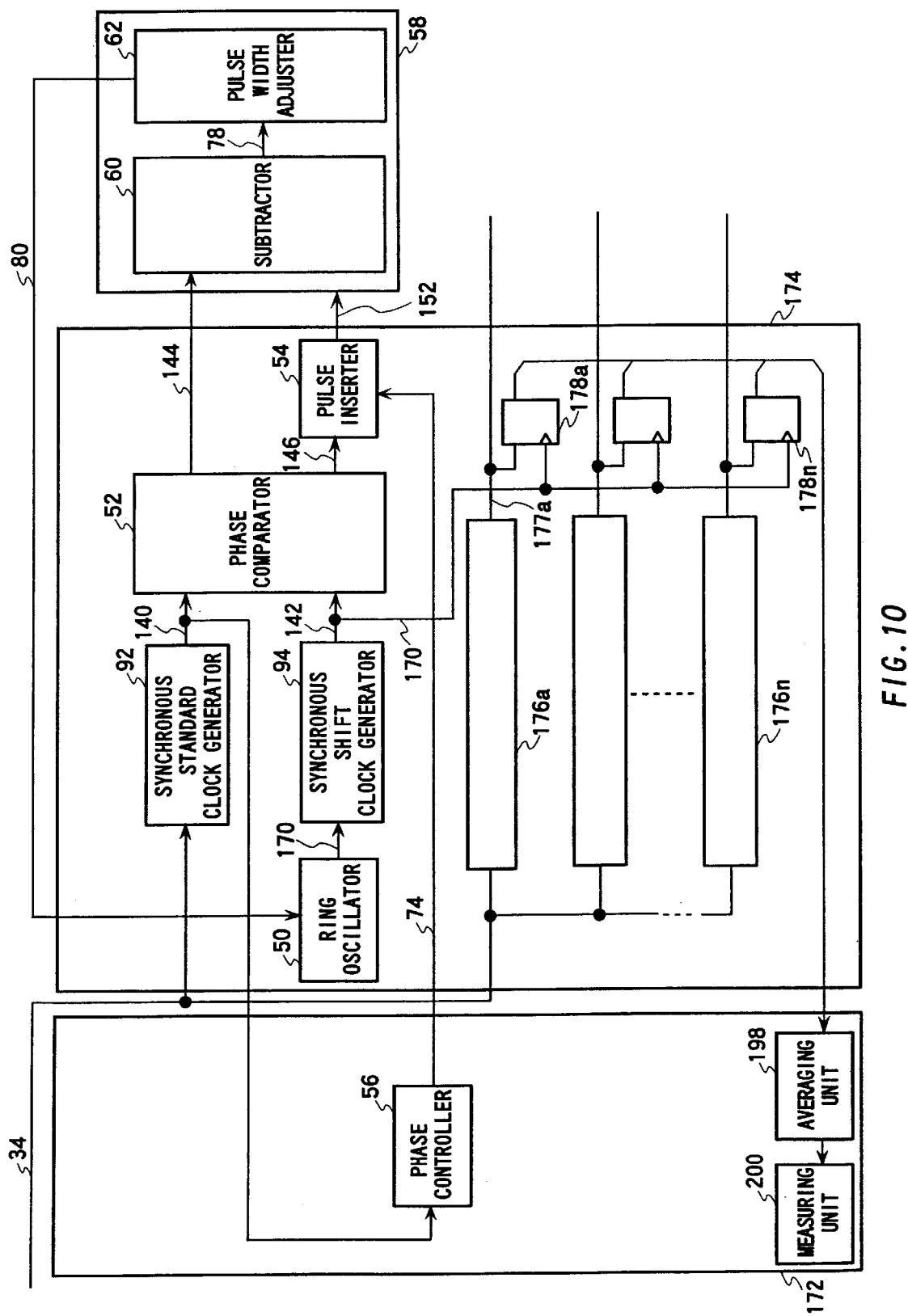
FIG. 10 is a block diagram of the delay time measuring apparatus, setting delay times of the delay lines 176.

FIG. 10 is a block diagram of a delay time measuring apparatus measuring delay times of delay lines 176, 176a to 176n. The delay time measuring apparatus includes a logical unit 172, a precise timing unit 174 and a phase-lock unit 58. The logical unit 172 has a phase controller 56, an averaging unit 198 and a measuring unit 200. The precise timing unit 174 has a ring oscillator 50, a synchronous standard clock generator 92, a synchronous shift clock generator 94, a phase comparator 52, a pulse inserter 54, delay lines 176a to 176n, and timing comparators 178a to 178n. The phase-lock unit 58 has a subtractor 60 and a pulse width adjuster 62. The ring oscillator 50, the phase comparator 52, the pulse inserter 54, the phase controller 56, the synchronous standard clock generator 92, the synchronous shift clock generator 94, the subtractor 60 and the pulse width adjuster 62 form the delay clock generating apparatus explained with reference to FIGS. 4 and 5. Operations of each of the elements of the delay clock generating apparatus for generating a delay clock in the delay time measuring apparatus will be explained in the following.

The standard clock 34 is input to the synchronous standard clock generator 92. The synchronous standard clock generator 92 divides the frequency of the standard clock 34 by eight to output a synchronous standard clock 140, which is the eighth subharmonic of the standard clock 34. The ring oscillator 50 oscillates a shift clock 70 having a same cycle as the standard clock 34. The shift clock 70 is input to the synchronous shift clock generator 94. The synchronous shift clock generator 94 divides the frequency of the shift clock 70 by eight, to output a synchronous shift clock 142 which is the eighth subharmonic of the shift clock 70. The phase comparator 52 adjusts the downward shift of the synchronous shift clock 142 to match the downward shift of the synchronous standard clock 140, to output a reference shift clock 146.

The synchronous standard clock 140 output from the synchronous standard clock generator 92, is supplied to the phase controller 56. The phase controller 56 outputs a phase control signal 74 indicating to the pulse inserter 54, cycles of the reference shift clock 146 to which the insert-pulses are inserted. The pulse inserter 54 inserts the insert-pulses to the cycles of the reference shift clock 146 indicated by the phase control signal 74 and outputs a reference shift clock 152 including the insert-pulses. The reference standard clock 144 and the reference shift clock 152 are input to the subtractor 60. The subtractor 60 subtracts the reference shift clock 152 from the reference standard clock 144 to give a subtraction result. The subtractor 60 then averages the subtraction result and supplies the averaged subtraction result 78 to the pulse width adjuster 62. The pulse width adjuster 62 outputs a voltage-adjusting signal based on the subtraction result 78, to adjust the source voltage of the ring oscillator 50. Thus, the oscillation frequency of the ring oscillator 50 is adjusted. The ring oscillator 50 oscillates the shift clock (delay clock) 70 having an accurate delay time with respect to the standard clock 34, based on the voltage-adjusting signal 80. The synchronous shift clock 142, i.e., the synchronous delay clock 170, which is the eighth subharmonic of the shift clock 70, has an accurate delay time with respect to the standard clock 34.

Operations and connection relationships of the elements of the delay time measuring apparatus which measures the delay times of the delay lines 176a to 176n using the delay clock generated by the above delay clock generating apparatus, will be explained in the following. The plurality of delay lines 176a to 176n respectively, have a plurality of delay elements the same as those explained with reference to FIG. 1. Therefore, each of the delay lines is capable of generating a desired delay time by combining the plurality delay elements. In this embodiment, the standard clock 34 is input to each of the delay lines 176a to 176n in order to measure the delay time of the delay lines 176a to 176n. Each of the delay lines 176a to 176n has an input terminal and an output terminal for the standard clock 34. The input terminal is connected to a standard clock supplying means, not shown in the drawings. The timing comparators 178a to 178n are flip-flop circuits, operated by the synchronous delay clock 170 having an accurate predetermined delay time with respect to the standard clock 34. The output terminals of the delay lines 176a to 176n are respectively connected to data inputs of the timing comparators 178a to 178n. Outputs of the timing comparators 178a to 178n are averaged by the averaging unit 198. The measuring unit 200 measures the delay times of the delay lines 176a to 176n based on the averaged result generated by the averaging unit 198.

A first embodiment of a method of measuring predetermined delay times of the delay lines 176a to 176n will be explained in the following. The first embodiment of the method of measuring delay times is characterized in that the method includes selecting a combination of the delay elements for each of the delay lines 176a to 176n each generating an equal delay time, as the predetermined delay time of the delay clock generated by the delay clock generating apparatus. The method of measuring delay times will be executed for each of the plurality of delay lines 176a to 176n, therefore, the method of measuring delay times for one of the delay lines 176a will be explained in the following.

A delay time of the delay line 176a is set by arbitrarily selecting the delay elements. It is desirable to select the delay elements such that the desired delay time and a theoretical delay time to be generated by the combination of the delay elements become equal. Then, the standard clock 34 is input to the input terminal of the delay line 176a, set to have the set delay time. The standard clock 34 is output from the delay line 176a as a delay pulse 177a, which is delayed by the selected delay elements. The delay pulse 177a is input to the data input of the timing comparator 178a. The synchronous delay clock 170 is input to the clock input of the timing comparator 178a. The shift clock (delay clock) 70 having the same frequency as the standard clock 34 may be input to the clock input.

The timing comparator 178a is a flip-flop circuit that compares the timing of the edge (the upward shift or the downward shift) of the delay pulse 177a and the edge (the upward shift or the downward shift) of the synchronous delay clock 170, and outputs the compared result as a logic value "0" or "1". The timing comparator 178a in this embodiment is a positive edge type flip-flop circuit, operated by the upward shift of the clock. Upon receiving the upward shift of the synchronous delay clock 170, the timing comparator 178a outputs the data input to the data input at that time. The output logic value is supplied to the averaging unit 198, and averaged by the averaging unit 198. For example, when the timing comparator 178a receives the upward shift of the synchronous delay clock 170 one hundred times and outputs the logic value "1" seventy times and the logic value "0" thirty times, the averaged value averaged by the averaging unit 198 becomes 0.7. The averaged value generated by the averaging unit 198 is supplied to the measuring unit 200. The measuring unit 200 then measures the delay time of the delay line 176a. In this embodiment, the measuring unit 200 judges whether or not the delay time of the delay line 176a and the delay time of the synchronous delay clock 170 are equal.

Figure 11:
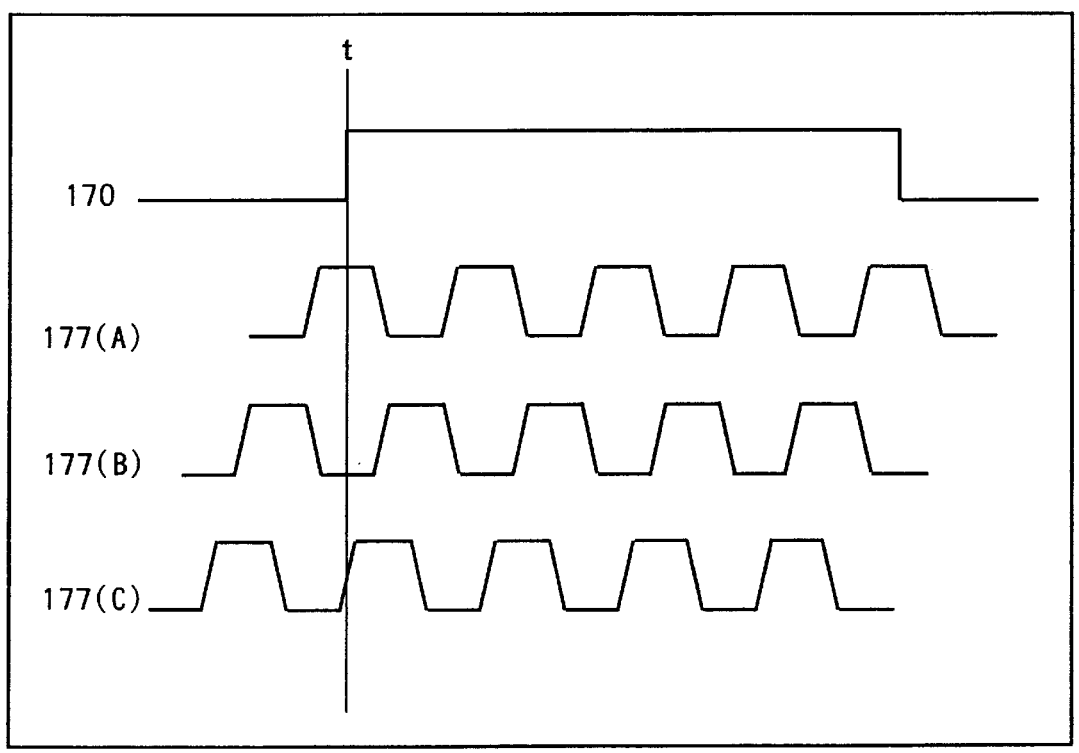

FIG. 11 is a timing chart showing timings of the synchronous delay clock 170, and the delay pulses 177(A), 177(B) and 177(C), input to the data input of the timing comparator 178a. The upward shift of the synchronous delay clock 170 is input to the clock input of the timing comparator 178a at the time "t".

The delay pulse 177(A) has a logic value "1" at time "t". As the synchronous delay clock 170 has a ⅛th frequency of the frequency of the delay pulse 177(A), the delay pulse 177(A) has the logic value "1" at the time when the next upward shift of the synchronous delay clock 170 is input. Therefore, the delay pulse 177(A) always has the logic value "1" at the time when the upward shifts of the synchronous delay clock 170 are input to the clock input of the timing comparator 178a. The timing comparator 178a always outputs the logic value "1". The averaged logic value averaged by the averaging unit 198 shown in FIG. 1 becomes "1" at this time.

The delay pulse 177(B) has a logic value "0" at time "t". Similar to the case explained for the delay pulse 177(A), the delay pulse 177(B) has the logic value "0" at the time when the next upward shift of the synchronous delay clock 170 is input. Therefore, the delay pulse 177(B) always has the logic value "0" at the time when the upward shifts of the synchronous delay clock 170 are input to the clock input of the timing comparator 178a. The timing comparator 178a always outputs the logic value "0". The averaged logic value averaged by the averaging unit 198 shown in FIG. 1 becomes "0" at this time.

The delay pulse 177(C), on the other hand, has either of the logic values "0" or "1" at the time "t". As the upward shift of the synchronous delay clock 170 is input to the timing comparator 178a, while the delay pulse 177(C) starts to shift upward and becomes "1", the output of the timing comparator 178a is either the logic value "1" or "0". The output of the timing comparator 178a is inconsistent and is not always "1" or "0". The averaged value of the output logic values from the timing comparator 178a is between zero and one. When the averaged value averaged by the averaging unit 198 is between zero and one, the measuring unit 200 judges that the delay time of the synchronous delay clock 170 and the delay time generated by the delay line 176a are almost equal. It is desirable to obtain an averaged logic value of 0.3 to 0.7 using the timing comparator 178a, for setting an optimized combination of the delay elements. It is more desirable to obtain an averaged logic value of about 0.5. When the timing comparator 178a outputs the logic value "1" or "0" for the same times among predetermined output times, the averaged logic value from the timing comparator 178a becomes 0.5. Then, the measuring unit 200 judges that the delay time of the delay line 176a equals the predetermined delay time of the synchronous delay clock 170. The data for the delay time of the delay line 176a measured as above, is stored in the memory 196 shown in FIG. 1, to be used for testing a semiconductor device.

As described above, when the delay pulse 177(A) is input to the timing comparator 178a, the averaged logic value from the timing comparator 178a becomes "1". When the delay pulse 177(B) is input to the timing comparator 178a, the averaged logic value from the timing comparator 178a becomes "0". The fact that the averaged logic value is "1" or "0" means that the delay time generated by the combination of the delay elements of the delay line 176a is not equal to the predetermined delay time of the synchronous delay clock 170. Therefore, the delay time generated by the delay line 176a can be adjusted, by changing the combination of the delay elements so that the averaged logic value from the timing comparator 178a is between zero and one, and preferably 0.5.

As explained with reference to FIGS. 10 and 11, the delay clock generating apparatus according to the present invention can generate a synchronous delay clock 170 having an accurate delay time. With this synchronous delay clock 170, the combination of the delay elements each having a predetermined delay time can be set, so that the delay line has the desired accurate delay time. In this embodiment, each of the delay lines 176a to 176n can have a desired delay time, and thus the plurality of delay lines are set in parallel. In this embodiment, an accurate delay time can be measured at the delay lines. As described above, the method of measuring delay times according to the present invention, can measure the delay times at low cost and at high-speed, compared with the conventional method of measuring delay times using an oscilloscope for measuring the delay times of the delay lines.

A second embodiment of a method of measuring predetermined delay times of the delay lines 176a to 176n will be explained in the following. The second embodiment of the method of measuring delay times is characterized in that the delay time is measured by matching the delay time of the delay line 176a with the delay time of the synchronous delay clock 170.

A delay time of the delay line 176a is set by arbitrarily selecting the delay elements. The standard clock 34 is supplied to the input terminal of the delay line 176a. The ring oscillator 50 oscillates the delay clock 70 having a predetermined delay time. The synchronous delay clock 170, which is the eighth subharmonic of the delay clock 70, is input to the clock input of the timing comparator 178a. The averaging unit 198 averages the output logic values from the timing comparator 178a.

The measuring unit 200 judges that the delay time generated by the combination of the arbitrarily selected delay elements is equal to the delay time of the synchronous delay clock 170, when the averaged logic value from the timing comparator 178a is between "0" and "1", and preferably 0.5. The measuring unit 200, on the other hand, judges that the delay time generated by the combination of the arbitrarily selected delay elements is not equal to the delay time of the synchronous delay clock 170, when the averaged logic value from the timing comparator 178a is either "0" or "1". The pulse width adjuster 62 adjusts the oscillation frequency of the ring oscillator 50 based on the averaged logic value provided by the averaging unit 198, to change the delay time of the delay clock 70. The delay time of the delay clock 70 is continuously adjusted until the averaged logic value from the timing comparator 178a is between "0" and "1". The measuring unit 200 judges that the delay time generated by the combination of the arbitrarily selected delay elements is equal to the delay time of the delay clock 70, when the averaged logic value from the timing comparator 178a is between "0" and "1". The data of the combination of the delay elements generating a predetermined delay time is stored in predetermined addresses of the memory 196 shown in FIG. 1, for each of the delay lines 176.

According to the present invention, the delay line 176 of the semiconductor testing device can generate a predetermined delay time in accordance with the characteristic of the DUT. The delay clock generating apparatus and/or the semiconductor testing device including the delay time measuring apparatus according to the present invention, can test the DUT at an accurate delay time. Although the delay indicator signal 36 is output through the delay line in the timing generator 14, the delay indicator signal 36 may be directly generated by the delay clock generating apparatus according to the present invention.

According to the present invention, a delay clock having an accurate delay time can be generated. Furthermore, an accurate delay time of the delay line can be measured.

According to the present invention, a precise delay clock can be generated. Delay time of the delay line of the semiconductor testing device, for example, according to the present invention, can be measured with accuracy.

Although the present invention has been described by way of exemplary embodiments, it should be understood that many changes and substitutions may be made by those skilled in the art without departing from the spirit and the scope of the present invention which is defined only by the appended claims.

What is claimed is:

1. A method of measuring a delay time of a delay line, said delay line comprising an input terminal and an output terminal for a standard clock, said output terminal being connected to a data input of a flip-flop circuit operated by a delay clock having a predetermined delay time with respect to said standard clock, the method comprising:

setting a constant delay time for said delay line;

supplying said standard clock to said input terminal of said delay line for which said constant delay time is set;

supplying a synchronous delay clock synchronizing said delay clock to a clock input of said flip-flop circuit;

averaging output logic values output from said flip-flop circuit; and measuring said constant delay time of said delay line based on averaged output logic values.

2. A method of measuring a delay time as set forth in claim 1, wherein said measuring steps judges that said constant delay time of said delay line is equal to said predetermined delay time of said delay clock when said averaged output logic value is about 0.5.

3. A delay time measuring apparatus measuring a delay time of a delay line, comprising:

delay clock generating means generating a delay clock having a predetermined delay time with respect to a standard clock;

standard clock supply means supplying said clock to said delay line;

a timing comparator comparing an edge of a delay pulse which is obtained by delaying said standard clock by said delay line and an edge of a synchronous delay clock synchronizing said delay clock, and outputting said compared result as a logic value "0" or "1";

averaging means generating an averaged value of said compared result output from said timing comparator; and measuring means measuring a delay time of said delay line based on said averaged value generated by said averaging means.

4. A delay time measuring apparatus as set forth in claim 3, wherein said timing comparator includes a flip-flop circuit having a data input to which said delay pulse is input and a clock input to which said synchronous delay clock is input.

5. A delay time measuring apparatus as set forth in claim 3, wherein said measuring means judges that said delay time of said delay line is equal to said predetermined delay time of said delay clock when said averaged value is about 0.5.

* * * * *